(12) United States Patent
Shi et al.

(10) Patent No.: US 8,223,503 B2
(45) Date of Patent: Jul. 17, 2012

(54) SECURITY COVER FOR PROTECTING THE COMPONENTS MOUNTED ON A PRINTED CIRCUIT BOARD (PCB) AGAINST BEING ATTACHED

(76) Inventors: Suxian Shi, Shenzhen (CN); Cunliang Tong, Shenzhen (CN)

( * ) Notice: Subject to any disclaimer, the term of this patent is extended or adjusted under 35 U.S.C. 154(b) by 872 days.

(21) Appl. No.: 12/306,541

(22) PCT Filed: Oct. 9, 2007

(86) PCT No.: PCT/CN2007/002904
§ 371 (c)(1),
(2), (4) Date: Dec. 24, 2008

(87) PCT Pub. No.: WO2009/036611
PCT Pub. Date: Mar. 26, 2009

(65) Prior Publication Data
US 2010/0242115 A1    Sep. 23, 2010

(30) Foreign Application Priority Data
Sep. 21, 2007    (CN) .......................... 2007 1 0077205

(51) Int. Cl.
*H05K 1/00*    (2006.01)

(52) U.S. Cl. .......................... 361/749; 361/752; 361/753
(58) Field of Classification Search ........... 361/748–752
See application file for complete search history.

(56) References Cited

U.S. PATENT DOCUMENTS

| | | | |
|---|---|---|---|
| 4,691,350 A | 9/1987 | Kleijne et al. | |
| 6,245,992 B1 | 6/2001 | Hou | |
| 6,355,316 B1* | 3/2002 | Miller et al. | 428/13 |
| 7,054,162 B2* | 5/2006 | Benson et al. | 361/760 |
| 7,549,064 B2* | 6/2009 | Elbert et al. | 713/194 |
| 2004/0120101 A1 | 6/2004 | Cohen et al. | |
| 2006/0090918 A1 | 5/2006 | Dangler et al. | |

FOREIGN PATENT DOCUMENTS

| | | |
|---|---|---|
| CN | 2397605 | 9/2000 |
| CN | 1510810 | 7/2004 |
| CN | 1790358 | 6/2006 |
| WO | 2007/018761 | 2/2007 |

* cited by examiner

*Primary Examiner* — Tuan T Dinh

(57) ABSTRACT

The present invention is available for the field of electronic circuit protection, and provides a security cover for enclosing a protective area on the protected PCB and protecting the components in this area. The security cover comprises a flexible PCB that is folded with a receiving space and an opening in a side in the space. The flexible PCB is covered on the protective area of the protected PCB and encloses the components in the protective area. The flexible PCB triggers the related circuits to remove or destroy the information on the components in this protective area in case of physical attack. The present invention is to enclose the key components on PCB via the flexible PCB with the receiving space so as to prevent the key components from being attacked.

8 Claims, 4 Drawing Sheets

SECURITY COVER FOR PROTECTING THE COMPONENTS MOUNTED ON A PRINTED CIRCUIT BOARD (PCB) AGAINST BEING ATTACHED

TECHNICAL FIELD

The present invention relates to electronic circuit protection field, in particular relates to a security cover for protecting the components on a PCB against being attacked.

BACKGROUND

At present, some of the highly sensitive data information, e.g. bank information, password and registration key stored in the electronic circuit are frequently attacked and embezzled without authorization. Therefore, protection on these data is attached much more importance to than ever before. Various protecting devices and methods come into being. Among them, an effective method to protect the sensitive data against being attacked without authorization is to use software in memory device serving to store the sensitive procedure of encrypting and decoding or data to prevent the sensitive data from being embezzled. However, this method depends on the decrypting and decoding password, and the decrypting and decoding password also requires physical and electronic protection against being easily attacked.

SUMMARY

A purpose of an embodiment of the present invention is to provide a security cover for solving the problem that the sensitive data information of the electronic circuit components is embezzled by physical means.

The embodiment of the present invention is achieved in this way: a security cover is used for enclosing the protective area on the protected PCB and providing protection for the components in this area. The security cover comprises a flexible PCB which is folded with a receiving space and an opening in a side in the space. The flexible PCB covers on the protective area of the protected PCB and encloses the components in the protective area therein. The flexible PCB triggers the related circuits to remove or destroy the information on the components in the protective area in case of physical attack.

The present invention encloses the key components on PCB via the flexible PCB with the receiving space, thereby benefiting the key components free from being attacked.

THE PREFERRED EMBODIMENTS

Objects, technical schemes and advantages of the present invention will be more apparent from the following detailed description of the embodiments with reference to the accompanying drawings. However, it is to be appreciated that the following description of the embodiments is merely to explain the present invention and is no way intended to limit the present invention.

The security cover of the embodiment of the present invention encloses the key components on the PCB with the hemispheric shaped or box-like flexible PCB, thereby making the key components free from being attacked. Further, the detection or supervision on the operation of the main system can not be performed due to the security cover. It is still impossible to obtain sensitive data information on the key electronic components by physical means.

Figure 1:
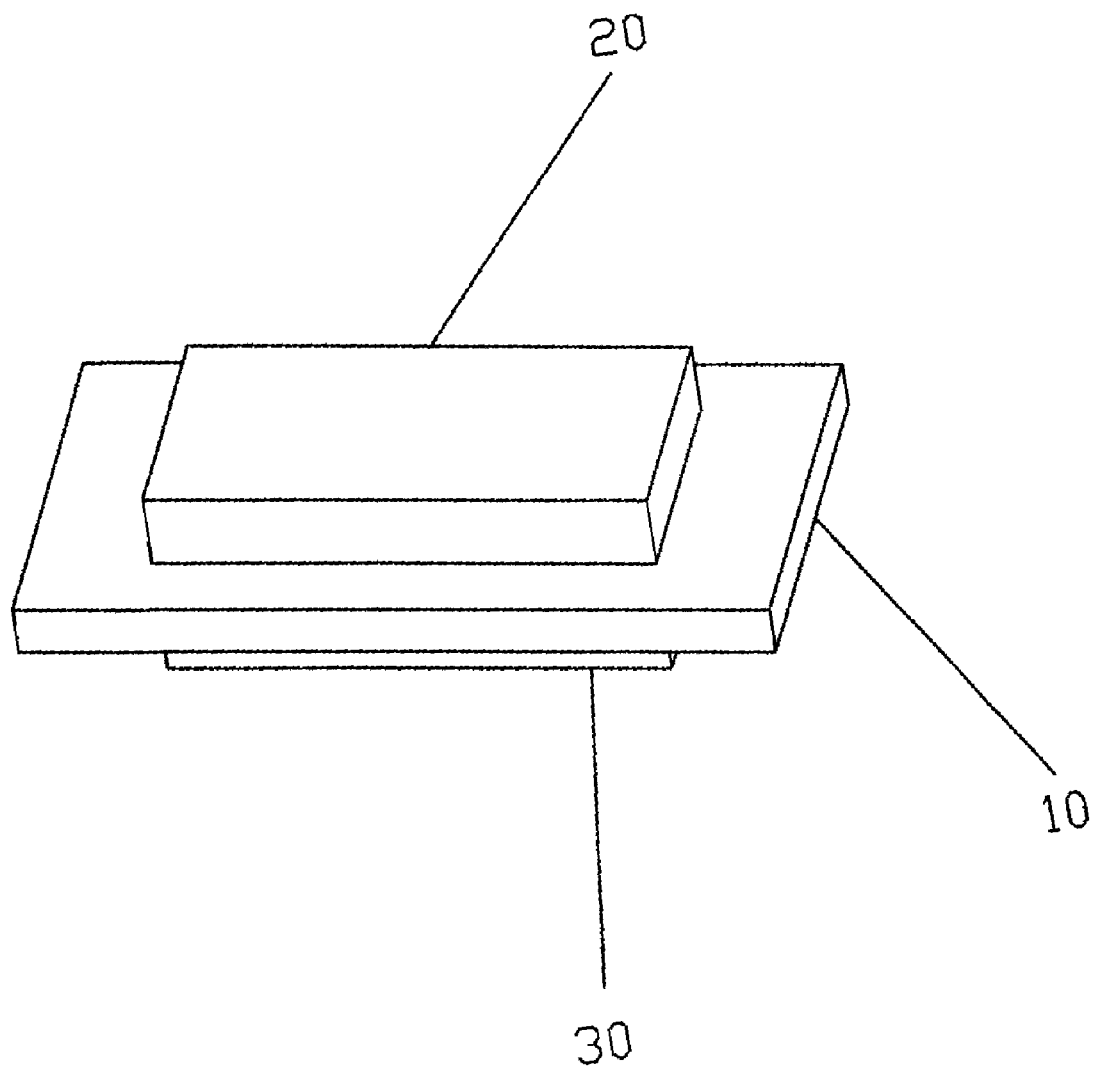
FIG. 1 is a schematic, isometric view of a security cover in use, in accordance with an embodiment of the present invention.

As shown in FIG. 1, the security cover of the embodiment of the present invention may be used for protecting the key components on the PCB 10, such as: CPU, flash memory, static memory, static random access memory, safety inspection device, bus and safety monitor port cable, etc. The security cover makes external detection or supervision on the main system unavailable, and getting password stored in the static memory by physical method impossible. The embodiment takes the protected PCB 10 with security covers 20, 30 equipped on two sides as an example for explanation. Alternatively, for actual application, only one side of the protected PCB is equipped with the security cover 20, while the other side is formed with the metal wires. In case of physical attack, disconnection or short circuit will be presented on these metal wires. This triggers the related circuits to destroy or remove the sensitive data information in the key components on the protected PCB 10, accordingly preventing the sensitive data information from being detected or embezzled.

Figure 2:
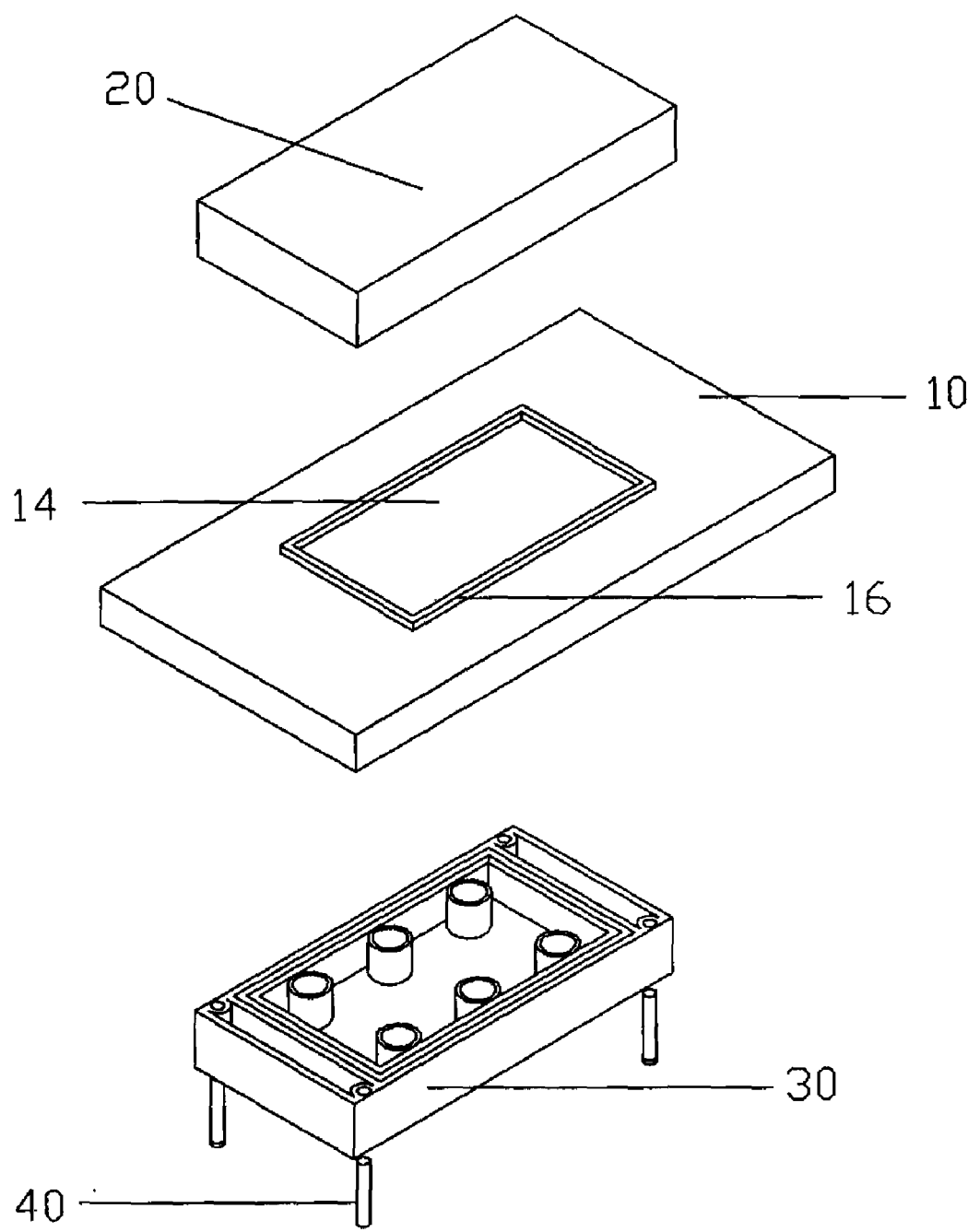
FIG. 2 is a partially exploded view of the security cover of FIG. 1.

As shown in FIG. 2, the key components on the protected PCB 10 are disposed in a protection area 14. The periphery of the protection area 14 is surrounded with a protection wall 16 with the function of preventing probe from piercing therein for detecting sensitive pins of the key components. A number of locking switches (not shown) are disposed in the protection area 14 of the protected PCB 10. The protection wall 16 is a PCB with multi routing layers and is welded on the protected PCB with the tin on the bonding pad. In case of piercing in the protection wall 16 with probe, the connection circuit on the protection wall 16 will form short circuit or disconnection to trigger the related circuits to start up the safety response device for removing or destroying the sensitive data information on the key components.

Figure 3:
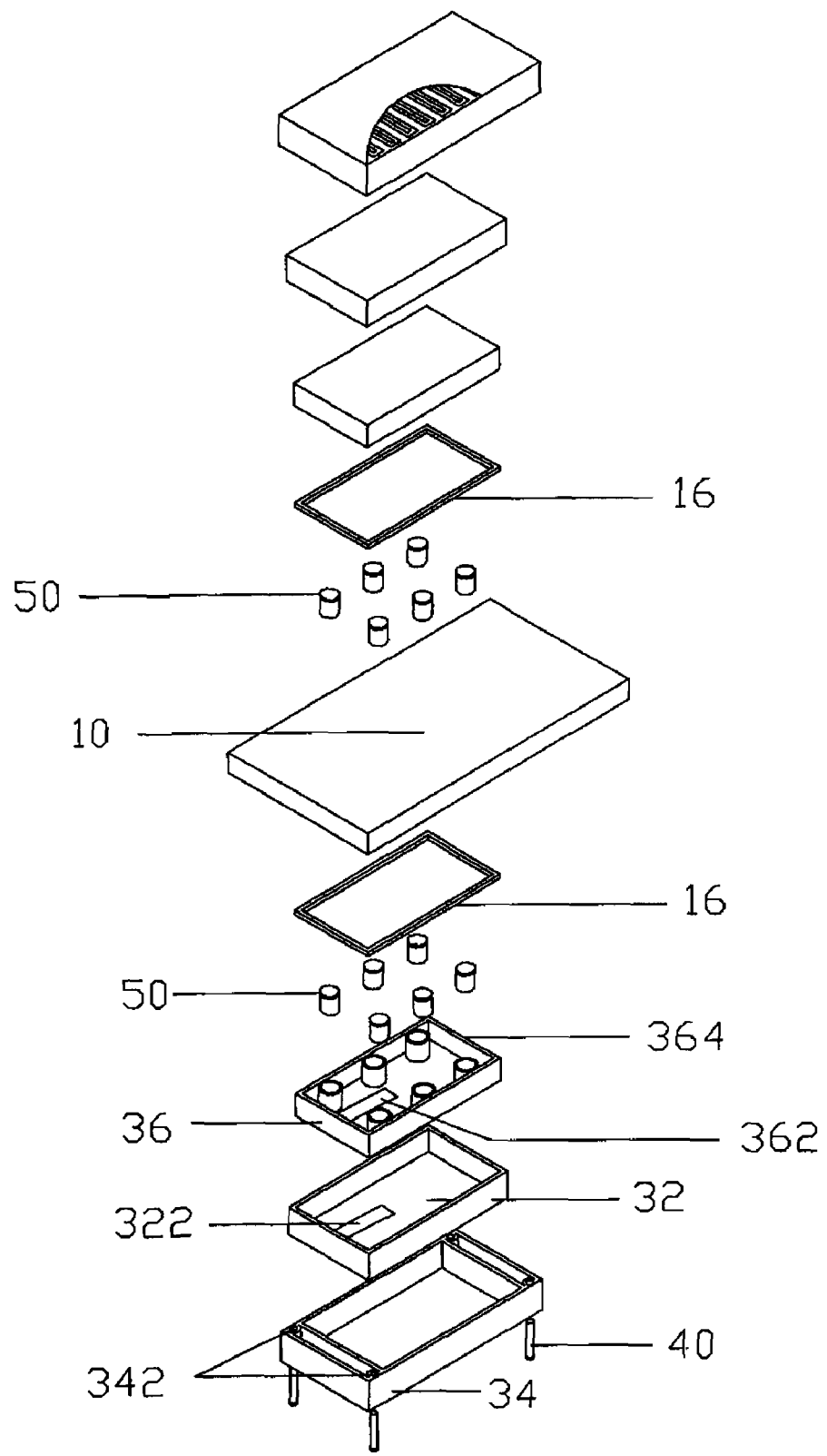
FIG. 3 is an exploded view of the security cover of FIG. 1.
Figure 4:
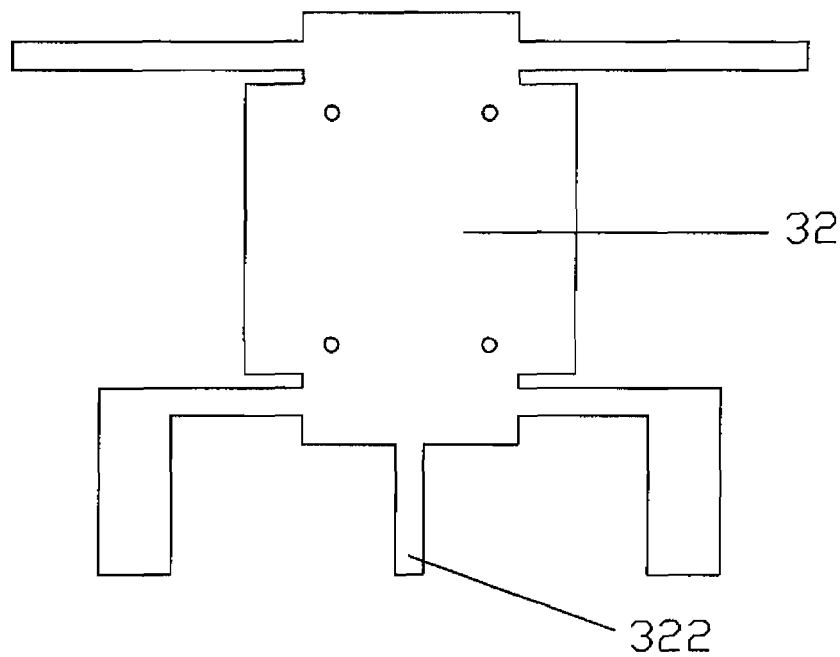
FIG. 4 is a schematic outspread view of a flexible PCB of the security cover according to the embodiment of the present invention.
Figure 5:
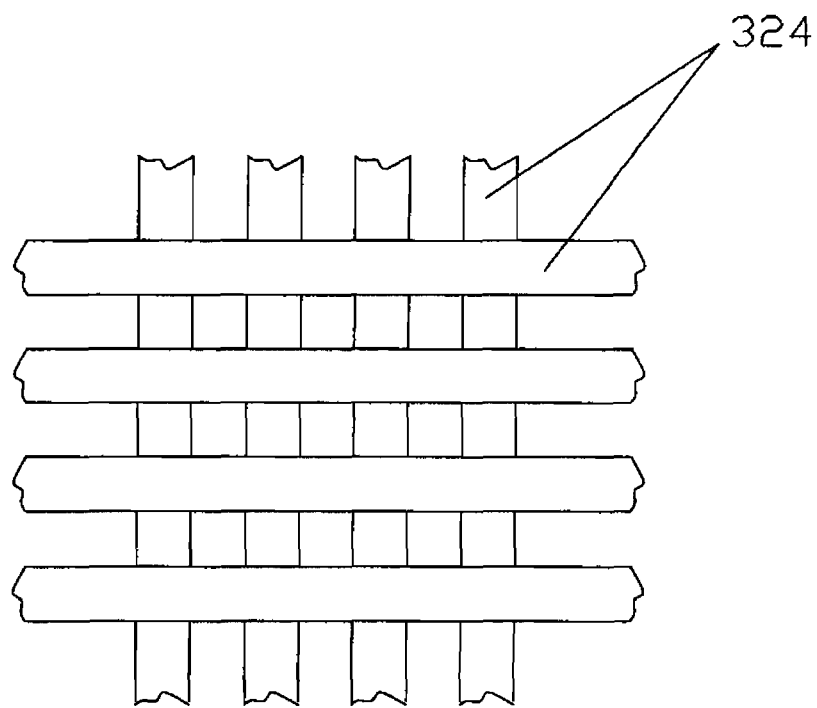
FIG. 5 is a schematic view of part of the wiring on the flexible PCB of the security cover according to the embodiment of the present invention.

The security covers 20 and 30 each are a kind of cover equipped with a flexible PCB inside. The protection wall 16 is covered in the security covers 20 and 30. The security cover 20 is in a structure essentially similar to that of the security cover 30, and the following implantation takes only the security cover 30 as an example. The flexible PCB 32 is a hemispheric shaped flexible PCB or box-like flexible PCB with five sides as shown in FIGS. 1-3, which defines a receiving space therein after being folded. Moreover, it can be opened and spread from the inside. FIG. 4 illustrates a plane outspread view of the box-like flexible PCB 32. The box-like flexible PCB 32 covers on the protection area 14 on the protected PCB 10 and encloses the components in the area. The box-like flexible PCB 32 further includes an inward curved tongue 322. The tongue 322 electrically connects the flexible PCB 32 to the protected main board 10. Multi routing layers are formed on the flexible PCB 32. Two circuitous parallel signal lines 324 are disposed on each routing layer. The line width of the two signal lines 324 and line interval between the two signal lines 324 are uniform. The lines 324 on neighboring routing layers cross each other while lines of two neighboring routing layers on the identical routing layer are, in parallel and offset. For example, the line 324 on the first layer is in horizontal direction, the line 324 on the second layer is then perpendicular to the line 324 on the first layer, while the line 324 on the third layer is in horizontal direction. However, the projection on the plane parallel to this routing layer of the lines 324 on the third and first layers do not cross, but offset, thereby causing the projection on the plane free of gap. That is to say, it is necessary to breakthrough of each routing layer for piercing into the flexible PCB. One signal line 324 on the flexible PCB 32 is provided with a low voltage, while the other line 324 is provided with a high voltage. As detection switch, in case that either of the two signal lines 324 is disconnected or that the two signal lines 324 become short circuit, the voltage signal of the lines 324 will change to trigger the related circuits to start up the safety response device for removing or destroying the sensitive data information on the key components in the protection area. In this embodiment, the two flexible PCBs 22 and 32 are connected in series. Therefore, it is necessary to breach both of the flexible PCBs for embezzling the information on the key components. Otherwise, it is impossible to embezzle the information on the key components in the protection area.

An external casing 34 is disposed on the exterior of the flexible PCB 32 and an inner casing 36 is disposed on the interior of the flexible PCB 32. The external casing 34 and internal casing 36 serve as the support for the flexible PCB 32 respectively from the external and internal sides. Both of the external casing 34 and internal casing 36 are plastic casings. The external casing 34 is fixed on the exterior of the flexible PCB 32, and a plurality of fasteners 342 is disposed at certain position on the exterior of the flexible PCB 32 for passing through of the screws 40. The internal casing 34 is fixed on the interior of the flexible PCB 32. The internal casing 34 defines an opening 362 at one side of the internal casing 36 in parallel with the protected PCB 10, and a number of hollow cylinders 364 vertical to the protected PCB 10. The opening 362 stretches from a side wall of the internal casing 26 to the place near the central part of the internal casing 36. The opening provides a physical path for the connection between the tongue 322 of the flexible PCB 32 and the protected PCB 10. The hollow cylinder 364 is provided with conductive carbon granules 50 therein. The conductive carbon granules 50 are in series connection with the locking switch on the protected PCB 10 under the pressure from the security cover 30 to make the locking switches in constant closed state. In case that the security cover is opened, conductive carbon granules breaks away from the protected PCB 10, as a result, locking switch is in off state. Thus the related circuits are triggered to make the safety response device start up to remove or destroy the sensitive data information on the key components in the protection area.

In this embodiment, the external casing 34 is fixed with the screws 40 passing through the fasteners 342. Consequently, the security cover 30 is fix on the protected PCB 10 to cause the conductive carbon granules 50 in the hollow cylinder 364 to be in connection with the locking switches on the protected PCB 10.

The security cover of the embodiment of the present invention encloses the key components on the protected PCB with a hemispheric shaped or box-like flexible PCB with receiving space. Further, the protected PCB is equipped with locking switches which are connected by the conductive carbon granules 50 fixed on the security covers 20 and 30. In case that the security covers 20 and 30 are opened, the conductive carbon granules break away from the locking switches, and thus the locking switch disconnects. As a result, lines on the flexible PCB are in disconnection status. In case of disconnection or short circuit of the lines on the flexible PCB or the disconnection of any locking switch of the cover, the related circuits will be triggered to start up the safety response device for removing or destroying the sensitive data information in the key components in this protection area. Therefore, the security cover is capable of effectively preventing the outside detection or supervision on the operation of the main system or getting the sensitive data information on the key electronic components by physical means.

Herein described embodiments are preferred embodiments of the present invention but it should not be construed as limiting the overall scope of the present invention. It will be apparent that various modifications, replacements and variations may be made in the present invention without departing from the spirit or scope of the present invention.

What is claimed is:

1. A security cover for enclosing a protective area on a protected printed circuit board (PCB) and protecting at least one component in the area, the security cover comprising
a flexible PCB which is folded with a receiving space and having an opening in one side in the space;
the flexible PCB covering on the protective area of the protected PCB and enclosing the at least one component in the protective area;
the flexible PCB triggering related circuits to remove or destroy information on the at least one component in the protective area in case of physical attack,
wherein an external casing is disposed on the exterior of the flexible PCB and an inner casing is disposed on the interior of the flexible PCB, the external and internal casings providing support and protection for the flexible PCB respectively from the external and internal sides, and
wherein a plurality of locking switches is disposed on the protected PCB, a plurality of hollow cylinders projecting out of the inner casing along a direction vertical to the protected PCB corresponding to the locking switches.

2. The security cover as claimed in claim 1, wherein the flexible PCB is provided with multi routing layers, two circuitous parallel lines being disposed on each routing layer, the lines on neighboring routing layers being crossed each other, lines on the identical routing layer being in parallel and staggered.

3. The security cover as claimed in claim 1, wherein a plurality of fasteners is disposed on the external casing and is positioned at the two sides of the flexible PCB, the security cover being fixed on the protected PCB by screws passing through the fasteners.

4. The security cover as claimed in claim 1, wherein the flexible PCB curves inwards to form a tongue, the flexible PCB being electrically connected to the protected PCB through the tongue, the inner casing having an opening, the opening providing a physical path for the connection between the tongue of the flexible PCB and the protected PCB.

5. The security cover as claimed in claim 1, wherein a plurality of conductive carbon granules is equipped in the hollow cylinder, the conductive carbon granules being connected in series with the locking switches under a pressure from the security cover to make the locking switches in constant closed state.

6. The security cover as claimed in claim 1, wherein a protection wall is disposed on the exterior of the protected PCB, the protection wall forming an inner cover in the security cover and being a printed circuit board with routing layers.

7. The security cover as claimed in claim 1, wherein the flexible PCB is in a hemispheric shape or in a box shape with five sides.

8. The security cover as claimed in claim 2, wherein line width and line interval of each routing layer on the flexible PCB are uniform.

* * * * *

UNITED STATES PATENT AND TRADEMARK OFFICE
CERTIFICATE OF CORRECTION

PATENT NO. : 8,223,503 B2
APPLICATION NO. : 12/306541
DATED : July 17, 2012
INVENTOR(S) : Shi et al.

It is certified that error appears in the above-identified patent and that said Letters Patent is hereby corrected as shown below:

Title page, Item (75), Inventors: "Suxian Shi" should read --Shuxian Shi--.

Signed and Sealed this
Twenty-fifth Day of June, 2013

Teresa Stanek Rea
*Acting Director of the United States Patent and Trademark Office*